US00RE37416B1

(19) United States
(12) Reissued Patent
Spatrisano et al.

(10) Patent Number: US RE37,416 E
(45) Date of Reissued Patent: Oct. 23, 2001

(54) METHOD FOR MANUFACTURING A MODULAR SEMICONDUCTOR POWER DEVICE

(75) Inventors: Antonio P. Spatrisano, Palermo; Luciano Gandolfi, Corsico; Carlo Minotti, Catani; Natale Di Cristina, Palermo, all of (IT)

(73) Assignee: STMicroelectronics S.r.l., Agrate (IT)

(21) Appl. No.: 08/558,979

(22) Filed: Nov. 13, 1995

(Under 37 CFR 1.47)

Related U.S. Patent Documents

Reissue of:
(64) Patent No.: 4,926,547
Issued: May 22, 1990
Appl. No.: 07/373,647
Filed: Jun. 27, 1989

U.S. Applications:
(63) Continuation of application No. 08/152,253, filed on Nov. 12, 1993, now abandoned, which is a continuation of application No. 07/864,492, filed on Apr. 7, 1992, now abandoned, which is a continuation of application No. 07/160,630, filed on Feb. 26, 1988, now abandoned.

(30) Foreign Application Priority Data

Mar. 9, 1987 (IT) ..... 19630 A/87

(51) Int. Cl.[7] ..... H05K 3/34
(52) U.S. Cl. ..... 29/841; 29/832
(58) Field of Search ..... 29/841, 832, 827, 29/840

(56) References Cited

U.S. PATENT DOCUMENTS 4,026,008 * 5/1977 Drees et al. ..... 437/211 X
4,102,039 * 7/1978 Henrickson et al. ..... 437/211 X
4,106,052 8/1978 Schierz .
4,396,936 8/1983 McIver et al. .
4,518,982 * 5/1985 Du Bois et al. ..... 357/81
4,530,152 * 7/1985 Roche et al. ..... 437/211 X
4,558,510 * 12/1985 Tani et al. ..... 437/211 X
4,615,031 9/1986 Eales et al. .
4,635,356 * 1/1987 Ohuchi et al. ..... 437/211 X
4,675,989 * 6/1987 Galloway et al. ..... 29/827 X
4,722,060 * 1/1988 Quinn et al. ..... 29/827 X
4,783,428 * 11/1988 Kalfus ..... 29/827
4,807,018 * 2/1989 Cellai ..... 357/81

FOREIGN PATENT DOCUMENTS

3336979 * 4/1984 (DE) .
3516995 * 11/1985 (DE) .
282124 * 9/1988 (EP) .
2495376 * 6/1982 (FR) .
1255073 * 11/1971 (GB) .
2099742 * 12/1982 (GB) .

* cited by examiner

*Primary Examiner*—Lee Young
*Assistant Examiner*—Rick Kiltae Chang
(74) *Attorney, Agent, or Firm*—Theodore E. Galanthay; Lisa K. Jorgenson; William J. Kubida

(57) ABSTRACT

The components used in the method comprise a heat-dissipating base plate, one or more three-layer plates (the top layer consisting of copper plates and strips) and a one-piece frame designed to constitute the terminals. After the chips have been soldered onto the upper plates and connected to the strips, the inner ends of the frame are soldered to points of connection with the chips. This is followed by the encapsulation in resin and the shearing of the outer portions of the frame, which, during the process, serve to temporarily connect the terminals.

39 Claims, 3 Drawing Sheets

FIG.6
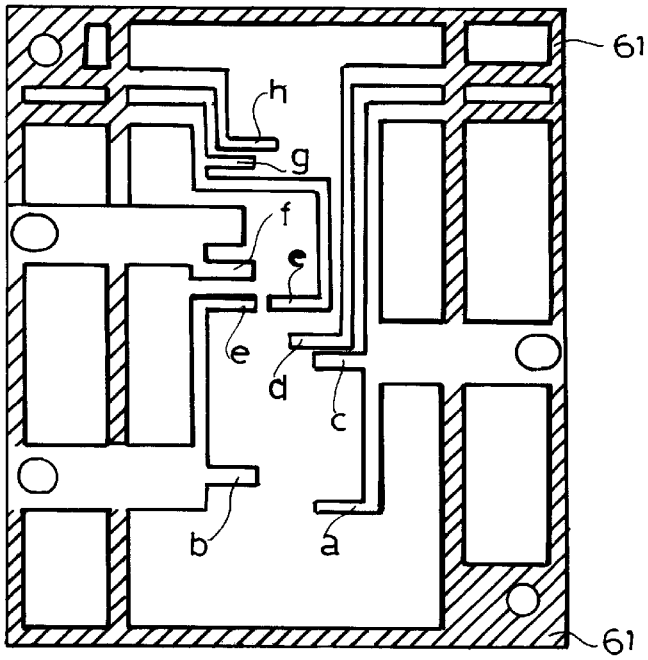
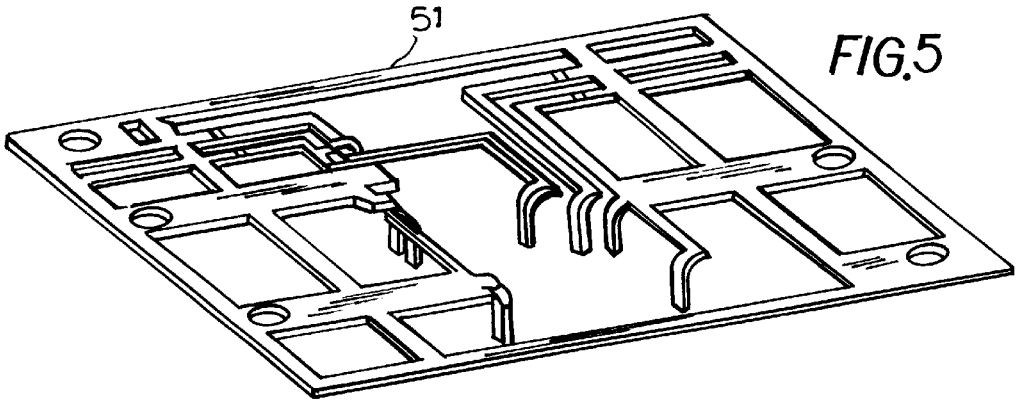
FIG.5
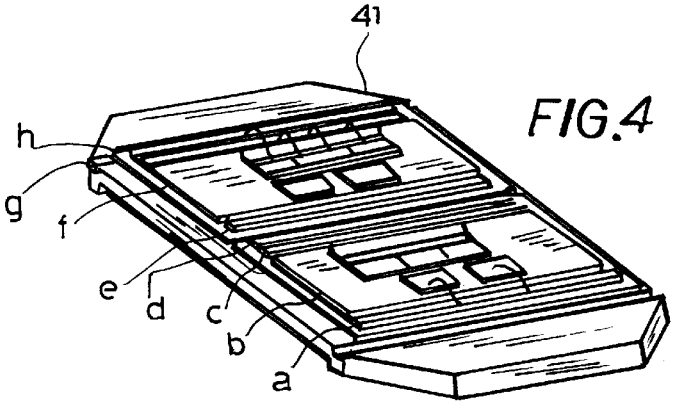
FIG.4

METHOD FOR MANUFACTURING A MODULAR SEMICONDUCTOR POWER DEVICE

Matter enclosed in heavy brackets [ ] appears in the original patent but forms no part of this reissue specification; matter printed in italics indicates the additions made by reissue.

*CROSS-REFERENCE TO RELATED APPLICATION*

This *is a continuation of application Ser. No. 08/152,253, filed on Nov. 12, 1993, now abandoned; which is a continuation of Ser. No. 07/864,492 filed on Apr. 7, 1992, now abandoned, which* is a continuation of co-pending application Ser. No. 07/160,630 filed on 26 Feb. 1988 now abandoned.

FIELD OF THE INVENTION

The present invention relates to a method of manufacturing a modular semiconductor power device and to a device as obtained by such method.

BACKGROUND OF THE INVENTION

In the manufacture of modular semiconductor power devices, as in the manufacture of numerous other components, an important target is to produce extremely reliable products using [sample] *simple* and inexpensive procedures.

The known semiconductor power devices involve complex and costly procedures, both from the point of view of the individual components necessary for constructing them and from the standpoint of their assembly and reciprocal insulation.

Some of these known devices are described in U.S. Pat. No. 4,518,982. This patent gives a detailed description of a modular power device whose manufacturing process consists of soldering one or more semiconductor chips onto a flat portion of a first electrode (which also serves as a heat sink), soldering other electrodes (possibly containing other chips) onto the flat portion by means of a dielectric adhesive material, electrically connecting the various chips and electrodes, encapsulating the device in resin, and electrically insulating the heat dissipating surface by means of a further layer of insulating material.

OBJECT OF THE INVENTION

The object of this invention is to provide a particularly reliable modular power device obtained by means of an extremely simple and not very expensive assembly procedure, according to a highly flexible manufacturing method and with components which, although extremely limited in number, can be used to create various circuit arrangements and layouts, always using the same tools and always [maintainins] *maintaining* an identical external geometrical configuration of the devices obtained.

SUMMARY OF THE INVENTION

According to a particular feature of the manufacturing method, the reciprocal [insulated] *insulation* of the electrodes and their encapsulation are carried out in a single step. The manufacturing method according to the invention for making a modular semiconductor power device comprising one or more semiconductor chips, a metal plate for dissipating heat generated by the Joule effect, a plurality of electrodes constituting the signal and power terminals of the device, and a resin encapsulation, comprises soldering the chip or chips onto one or more plates of electrically conductive material;

positioning the plate or plates on a plane substantially parallel to the aforesaid heat dissipating plate and close to the latter;

blanking, from a single sheet of conductive material, a one-piece frame designed to constitute the power and signal terminals, the blanking enabling temporary connections to be kept between the portions of the terminal conductors designed to remain outside of the resin encapsulation;

soldering the inner ends of the terminals to points arranged for the connection to the aforesaid chips;

encapsulating with [insulting] *insulating* resin all the active parts of the device, leaving uncovered the outer surface of the plate and the portions of the terminals involved with the aforesaid temporary connections; and shearing the temporary connections.

Each sheet can be made of copper and [that] the latter, before the chips are soldered onto it, can be placed in a plate consisting of three layers soldered directly onto each other, in which the first layer is made up of the sheet and copper strips insulated from the sheet itself. The intermediate *layer* consists of an alumina plate and the third layer consists of a sheet of copper substantially equal in size or slightly smaller than the intermediate layer. The [aforesaid] points of connection are situated on the aforesaid sheets and strips, the soldering of the inner ends of the terminals to the aforesaid points is preceded by the soldering of wires connecting the chips to the aforesaid strips.

The sheet can be soldered onto the internal surface of the plate and the connections between chips and strips can be made by means of ultrasound soldering of aluminum wires.

The aforesaid points of connection with the chips can be located on the aforesaid sheets and on wettable metal coatings on the surface of the chips.

After blanking of the one-piece frame and before the aforesaid soldering of the inner ends of the terminals to the points of connection, the inner ends of the terminals can be bent in a direction perpendicular to the plane of the frame.

After the encapsulation and the shearing of the temporary connections of the one-piece frame, the terminals designed to perform the function of signal terminals can be bent in a direction perpendicular to the base plate, while the terminals designed to perform the function of power terminals can be bent over the capsule in a direction parallel to the base plate itself.

BRIEF DESCRIPTION OF THE DRAWINGS

The features of the invention will be more clearly evident from the following description and the accompanying drawing in which:

FIG. 4 is a view of the base plate of FIG. 1 after the substrates and the chips have been joined to it, and after the electrical connections between chips and metal coating of the substrates have been made;

FIG. 5 is a perspective view of the one-piece frame for obtaining the external terminals and their connections with the metal-coating of the substrates;

FIG. 6 is a plan view of the flattened frame from which the frame of FIG. 5 was obtained;

SPECIFIC DESCRIPTION

Figure 1:
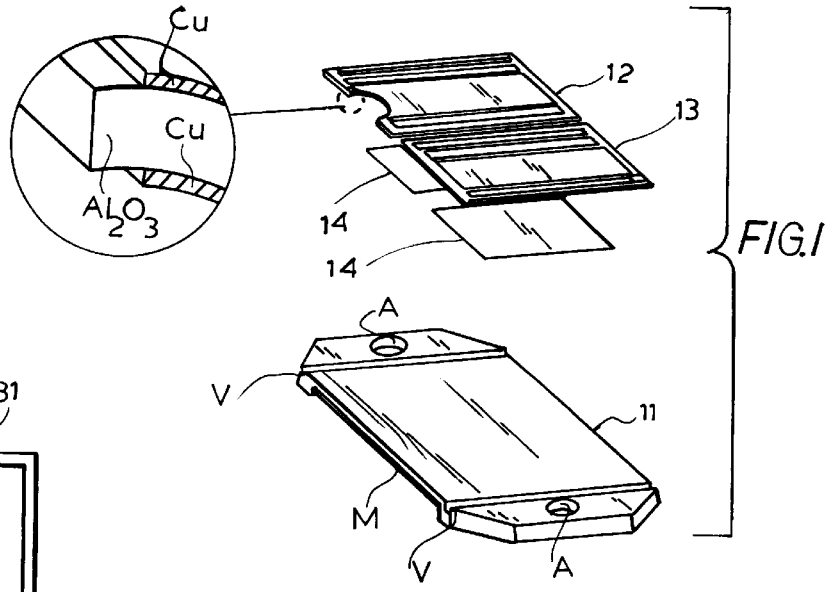
FIG. 1 is an exploded view of the base plate and the substrates supporting the chips[.]

In FIG. 1 the base plate 11 of the device acts as a heat sink as well as a support and fastener for the device itself. It is made of heat-conductive metal with high mechanical strength. The holes A in it serve to secure it, by means of screws, onto the external heat spreader, while the grooves V serve to absorb any possible deformation of the base plate due to the high tightening torque, thereby preventing them from being transmitted to the central portion of the plate.

Figure 2B:
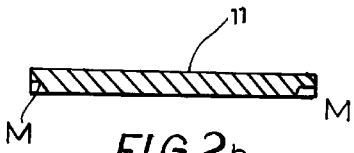
FIGS. 2*a* and 2*b*, respectively, are a side view and a cross-sectional view of the base plate of FIG. 1.
Figure 2A:
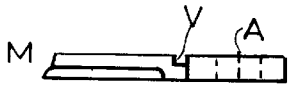

The S-shaped recesses M, on the sides (see the side and cross-sectional views of the plate shown in FIGS. 2*a* and 2*b*) serve to ensure a better adhesion of the subsequently applied resin encapsulation, as is explained more clearly further on with reference to FIG. 8*b*.

FIG. 1 also shows the components 12 and 13, which are two chip-supporting substrates, which are soldered onto the base plate 11 by means of the layers of solder 14.

Figure 3A:
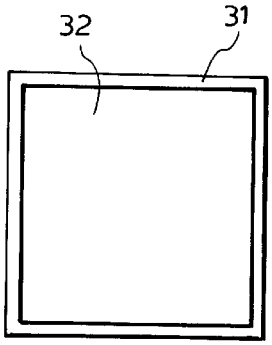
FIGS. 3*a*, 3*b* and 3*c*, respectively, are bottom, top and cross-sectional views of a substrate of FIG. 1.
Figure 3C:
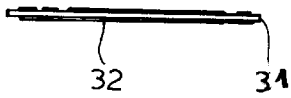
Figure 3B:
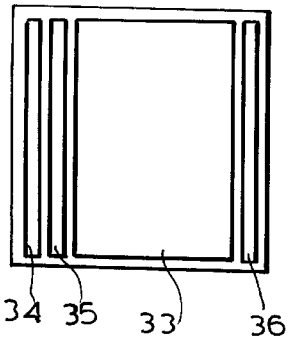

As illustrated in FIGS. 3*a*, 3*b* and 3*c* (bottom, top and cross-sectional views of a substrate) each substrate is composed of a quadrangular-shaped thin medial layer 31 of alumina (less than 1 mm thick), with thin copper plates soldered directly onto its two lateral faces. More precisely, soldered onto the face destined to lie facing the upper face of the base plate 11 is a single copper plate 32, which is also quadrangular in shape but with slightly smaller dimensions than those of the layer of alumina, while the other face is provided with a rectangular plate 33, for supporting the chips and for the connections with an external electrode, and, on either side of said plate 33, narrower plates (lateral strips) 34, 35 and 36 designed both for soldering the conductor for connection with the chips, and for soldering other external electrodes.

FIG. 4 shows the device 41 as it appears after the two [substrate] *substrates* have been soldered onto the base plate, the chips have been soldered onto the larger upper copper plates b and f, and the electrical connections have been carried out between the chips and the lateral strips a, c, d, e, g, *and* h. The latter connections are obtained by ultrasonic soldering with aluminum wire.

FIG. 5 shows a copper frame 51 designed to constitute the external terminals and the connections of the latter with the lateral strips and the plates f and b of FIG. 4. The frame of FIG. 5 is obtained by blanking from a copper sheet and by subsequently bending the terminal portions downwards, said terminal portions being subsequently soldered onto the lateral strips and the plates f and b.

FIG. 6 shows a plan view of the frame of FIG. 5, as it appears after being blanked from the copper sheet and before the bending of the terminal portions, which are indicated respectively by h, g, e, d, c, a, f, *and* b. After being bent downwards, the terminal portions are then soldered respectively onto the strips h, g, e, d, c, *and* a, and onto the plates f and b of 41. After the frame 51 has been soldered onto the device 41, the device is encapsulated by means of a molding process with [insulting] *insulating* resin (e.g. thermosetting epoxy resin), preferably of the low-stress type.

Figure 7:
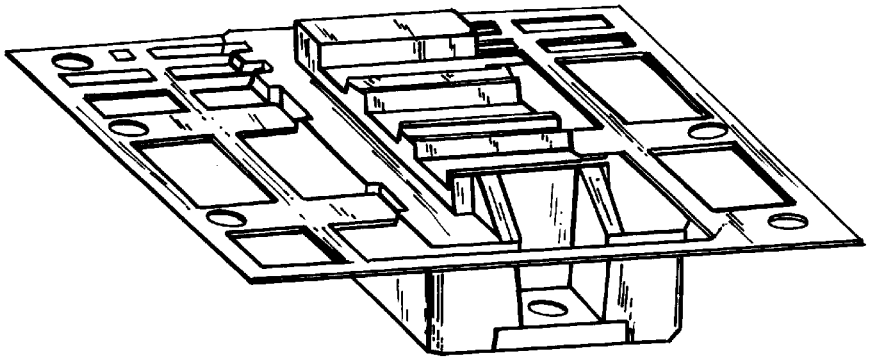
FIG. 7 is a perspective view of the modular device after the resin encapsulation has been carried out by molding.

After the moldings phase, the device has the appearance shown in FIG. 7. At this point, in order to complete [complete] the device, it is necessary to shear the external temporary connections between the terminals, corresponding to the portions 61 illustrated in [dotted] *cross-hatched* lines in FIG. 6, and then bend the signal terminals upwards to a vertical position, and the power terminals inwards.

Figure 8A:
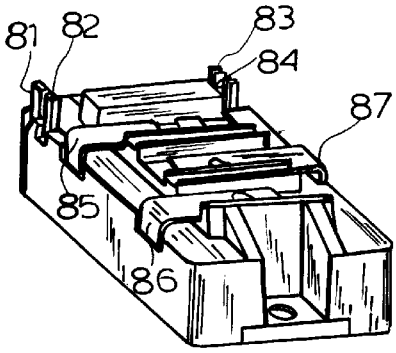
FIGS. 8*a*, 8*b* and 8*c* are respective perspective top and bottom views and a plan view of the finished device.
Figure 8B:
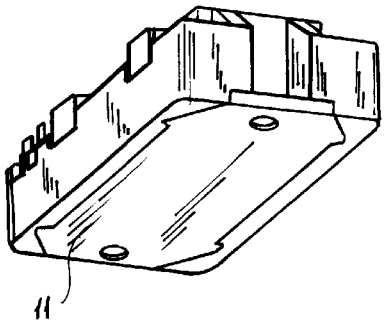

The finished device takes on the appearance of FIG. 8*a* (top perspective view) and of FIG. 8*b* (bottom perspective view), in which 81, 82, 83 and 84 indicate the signal terminals and 85, 86 and 87 indicate the power terminals.

As shown in FIG. 8*b*, the resin encapsulation ends, from below, *are* flush with the lower surface of the base plate 11, which can consequently be secured in direct contact with the supporting metal structure on which it is designed to be placed, thereby ensuring efficient dissipation of the heat. The same figure clearly shows the function of the S-shaped recesses M on the base plate (see FIGS. 1 and 2*b*). In fact, on completion of the device, they are completely embedded in the resin body, so as to constitute two areas for anchoring and ensuring an efficient grip of the resin.

Figure 8C:
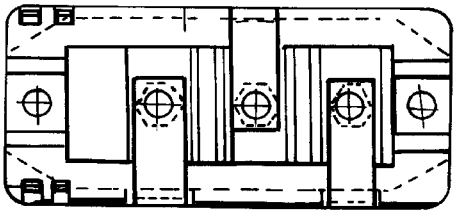

As shown in FIG. 8*c* (plan view of the device), after the bending, the terminal holes of the three power terminals 85, 86 and 87 come to rest exactly above the three hexagonal nuts embedded in the resin, so as to enable the electrical connection with the external connecting rods.

The foregoing description gives a clear idea both of the versatility of the method of the invention and of the simplicity of the assembling procedure. In fact, it is clear that:

with the substrates of FIG. 1 and FIG. 3, it is possible to use chips of different number and sizes, to achieve different connections of the chips with the lateral strips, and to obtain soldered strips with different geometrical layouts;

the one-piece of FIG. 5 and FIG. 6 can also be made with different geometrical layouts, to enable it to adapt to the different geometrical layouts of the aforesaid soldered strips, and to the different electrical functions of the device;

the procedures for soldering the conductors connecting the chips to the metal strips and the external electrodes to the metal chip-supporting strips or plates are simplified due to the flat disposition of the soldering points and to the fact that the inner ends of the electrodes are soldered when they are still firmly secured to each other by the aforesaid temporary connections; and due to the fact that the chips are soldered onto coplanar plates and to the presence of the temporary connections between the electrodes it is also possible to carry out the encapsulation and reciprocal insulation of the electrodes in a single step. A further advantage, in addition to those mentioned previously, is related to the particular structure of the substrate chosen for soldering the chips as well as that related to the type of resin used for the encapsulation. In fact, these substrates, which consist of a layer of alumina with copper plates soldered directly onto both faces, are characterized by thermal expansion coefficients very similar to those of silicon. This reduces to a minumum the thermomechanical stress which would otherwise be transmitted to the chips due to the differential expansion of silicon and copper (other embodiments envisage the insertion, between the chips and the supporting copper plates, of layers of material, such as for example, molybdenum, having an expansion coefficient lying half way between those of silicon and copper, which however complicate the assembling and lower the thermal performance).

The use of a low-stress type of resin helps to limit the stress transmitted to the chips even in the case of chips of very large dimensions.

It is also clear that numerous modifications, adjustments, variations and substitutions may be made to the embodiments previously described by way of example, always remaining within the spirit of this invention and its scope. For example, the wires connecting the chips to the metal strips of the substrates can be by direct soldering between the inner terminal portions of the one-piece frame and the chips, whenever the latter have wettable metal coatings. These internal portions can then be soldered to points (P) of connection with the chips situated on the aforesaid plates 33 and strips 34, 35, 36 (as in the case illustrated in FIGS. 4 and 5), or situated on the same plates and on wettable metal coatings on the surface of the chips.

Likewise, the chip-supporting substrates could have a different structure from that previously described and the insulation between the chips and the dissipator could be achieved by means of a layer of the encapsulating resin itself—which in this case should be of high thermal conductivity—instead of by a layer of alumina.

We claim:

1. A method of manufacturing a modular semiconductor [power] device, comprising the steps of:

[(a) welding semiconductor means including at least one] *attaching a* semiconductor chip onto [conductive-sheet means including at least one] *a* sheet of [an] electrically conductive material;

[(b) forming a power-device body by fixing] *affixing* said sheet to [a member provided with] a heat-dissipating [metal] plate [for dissipating heat generated by the Joule effect and parallel to and close to said heat-dissipating plate];

[(c) blanking from a single sheet of conductive material a one-piece] *forming a* frame [formed] with strips [adapted to form] *for* signal and power terminals [of] *for* said [device] *semiconductor chip,* and with temporary connections between *at least some of* outer ends of said strips;

[(d) soldering] *selectively connecting* inner ends of said strips [selectively] to [points of] said [conductive sheet means connected with said semiconductor means] or to said semiconductor [means] *chip*;

[(e)] encapsulating at least [active] parts of said [body] *semiconductor chip, said sheet of electrically conductive material,* and said inner ends of said strips [with an insulating resin and leaving said outer ends of said strips and an outer surface of said plate uncovered by said resin]; and

[(f) shearing] *removing* said temporary connections from said strips.

2. The method defined in claim 1 [wherein said conductor sheet means comprises a plurality of sheet members composed of copper, said sheet means being disposed] *further comprising forming said sheet of electrically conductive material by disposing a first electrically conductive sheet member* on a *first* face of an intermediate layer [formed with an alumina plate, and a further sheet of copper of a size at most equal to that of the intermediate layer] and [disposed] *disposing a second electrically conductive sheet member* on [another] *a second* face of said intermediate layer, [said inner ends of said strips being soldered to said sheet members and a plurality of chips forming said semiconductor means and connected with wires soldered to said sheet members].

3. The method defined in claim 2 wherein said [further] *step of affixing said* sheet [is soldered] to a surface of said heat-dissipating [metal] plate [opposite said outer surface, connections between said chips and said sheet members being made by ultrasonic soldering of aluminum wires] *comprises attaching said second electrically conductive sheet member to said heat-dissipating plate.*

4. [The method defined in claim 1 wherein said inner ends are selectively connected to wettable metal coatings on surfaces of chips forming said semiconductor means.] *The method defined in claim 3 wherein said step of attaching said second electrically conductive sheet member to said heat-dissipating a plate comprises soldering said second electrically conductive sheet member to said heat-dissipating plate.*

5. [The method defined in claim 1 wherein, after blanking of said one-piece frame and prior to the soldering of said inner ends of said strips, said inner ends of said strips are bent in a direction perpendicular to a plane of said frame.] *The method defined in claim 4 wherein said step of soldering said second electrically conductive sheet member to said heat-dissipating plate comprises ultrasonically bonding said second electrically conductive sheet member to said heat-dissipating plate.*

6. [The method defined in claim 1 wherein, after encapsulation and shearing os said temporary connections, selected ones of said strips adapted to form signal terminals are bent in a direction perpendicular to said base plate while others of said strips adapted to form power terminals are bent over the encapsulating resin in a direction parallel to said base plate.] *The method defined in claim 2 wherein said step of disposing a first electrically conductive sheet member on a first face of an intermediate layer comprises disposing a first electrically conductive sheet member on a first face of an alumina layer.*

*7. The method defined in claim 2 wherein said steps of forming said sheet of electrically conductive material comprises disposing a first sheet member comprising copper on a first face of the intermediate layer and disposing a second electrically conductive sheet member comprising copper on a second face of said intermediate layer.*

*8. The method defined in claim 2 further comprising disposing a plurality of additional sheet members on said first face of said intermediate layer.*

*9. The method defined in claim 1 wherein said inner ends of said strips are selectively connected to wettable metal coatings on surfaces of said semiconductor chip.*

*10. The method defined in claim 1 wherein, after forming said frame and prior to the selectively connecting of inner ends of said strips, said inner ends of said strips are bent in a direction perpendicular to a plane of said frame.*

*11. The method defined in claim 1 wherein said encapsulating step comprises encapsulating at least parts of said semiconductor chip, said sheet of electrically conductive material, and said inner ends of said strips with an encapsulating resin, and wherein, after encapsulation and removing of said temporary connections, selected strips of said frame are adapted to form signal terminals bent in a direction perpendicular to said heat-dissipating plate while other selected strips of said frame are strips adapted to form power terminals bent over the encapsulating resin in a direction parallel to said base heat-dissipating plate.*

*12. The method defined in claim 1 wherein said step of affixing said sheet to said heat-dissipating plate comprises affixing said sheet to allow heat generated by a Joule effect to be dissipated.*

*13. The method defined in claim 1 wherein said step of affixing said sheet to said heat-dissipating plate comprises*

*affixing said sheet parallel to and close to said heat-dissipating plate.*

*14. The method defined in claim 1 wherein said step of forming a frame comprises blanking a single sheet of conductive material.*

*15. The method defined in claim 1 wherein said step of selectively connecting inner ends of said strips comprises soldering said inner ends of said to said sheet of electrically conductive material or to said semiconductor chip.*

*16. The method defined in claim 1 wherein said step of encapsulating at least parts of said semiconductor chip said sheet of electrically conductive material, and said inner ends of said strips comprises encapsulating said at least parts of said semiconductor chip, said sheet of electrically conductive material, and said inner ends of said strips with an insulator.*

*17. The method defined in claim 11 wherein said step of encapsulating said semiconductor chip, said sheet of electrically conductive material, and said inner ends of said strips with an insulator comprises encapsulating said at least parts with an insulating resin.*

*18. The method defined in claim 1 wherein said step of encapsulating at least parts of said semiconductor chip, said sheet of electrically conductive material, and said inner ends of said strips with an insulator comprises leaving said outer ends of said strips uncovered by said insulator.*

*19. The method defined in claim 1 wherein said step of removing said temporary connections from said strips comprises shearing said temporary connections.*

*20. A method for making a semiconductor package, comprising:*

*attaching a semiconductor device to a first surface of a substrate, said substrate having power leads on said first surface;*

*electrically connecting said semiconductor device to said power leads;*

*connecting selected leads of a lead frame with said power leads, said lead frame having a plurality of said leads temporarily attached to each other; and*

*encapsulating at least portions of said selected leads and said semiconductor device.*

*21. The method of claim 20 further comprising locating said substrate on a heat sink body prior to locating said lead frame.*

*22. The method of claim 20 wherein said step of attaching a semiconductor device to a first surface of a substrate comprises attaching a semiconductor device on a first surface of an insulating substrate.*

*23. The method of claim 22 wherein said step of attaching a semiconductor device to a first surface of an insulating substrate comprises attaching a semiconductor device on a first surface of an alumina layer.*

*24. The method of claim 23 wherein said step of attaching a semiconductor device to a first surface of an insulating substrate comprises providing a conductive layer on said alumina layer and locating said semiconductor device on said conductive layer.*

*25. The method of claim 24 wherein said step of providing a conductive layer on said alumina layer on which said semiconductor device is located comprises providing a layer comprising copper.*

*26. The method of claim 20 wherein said step of attaching a semiconductor device to a first surface of a substrate comprises attaching a semiconductor device to a first surface of a sandwich comprising an alumina layer having said power leads on one surface of said substrate and a conductive layer on another surface of said substrate.*

*27. The method of claim 26 wherein said step of attaching a semiconductor device to a first surface of a sandwich comprising an alumina layer having said power leads on one surface of said substrate and a conductive layer on another surface of said substrate comprises attaching a semiconductor device to a first surface of a sandwich comprising an alumina layer having said power leads on one surface of said substrate and a conductive layer comprising copper on another surface.*

*28. The method of claim 27 further comprising locating said conductive layer comprising copper a body.*

*29. The method of claim 20 wherein said step of attaching a semiconductor device to a first surface of a substrate comprises providing an insulating layer having three topside conductors, one of which is for carrying said semiconductor device, and two of which are for providing power contacts.*

*30. The method of claim 29 further providing connecting wires from said two topside conductors for providing power contacts to said semiconductor chip.*

*31. The method of claim 29 wherein said three topside conductors comprises copper.*

*32. A method for making a package containing at least one semiconductor device comprising:*

*fabricating a structure comprising an insulating layer and plural top conductive layers on said insulating layer;*

*electrically coupling a semiconductor device to at least one of said top conductive layers so that at least some of said top conductive layers can supply power to said semiconductor device;*

*electrically contacting plural leads to at least some of said top conductive layers; and*

*encapsulating at least portions of said semiconductor device and said structure.*

*33. The method of claim 32 wherein said insulating layer is alumina.*

*34. The method of claim 32 further comprising forming said semiconductor device to present power leads external to said encapsulated portions.*

*35. The method of claim 32 further comprising attaching a heat sink to said insulating layer with a bottom conductive layer on said insulating layer between said insulating layer and said heat sink.*

*36. The method of claim 35 wherein said conductive layer between said insulating layer and said heat sink comprises copper.*

*37. The method of claim 32 further comprising providing three topside conductors, one of which for carrying said semiconductor chip and two of which for providing power contacts.*

*38. The method of claim 37 further providing connecting wires from said two topside conductors for providing power contacts to said semiconductor chip.*

*39. The method of claim 37 wherein said three topside conductors comprise copper.*

* * * * *